United States Patent
Antonakopoulos et al.

(10) Patent No.: US 8,495,471 B2
(45) Date of Patent: Jul. 23, 2013

(54) SOLID-STATE STORAGE SYSTEM WITH PARALLEL ACCESS OF MULTIPLE FLASH/PCM DEVICES

(75) Inventors: Theodore A. Antonakopoulos, Patras (GR); Roy D. Cideciyan, Rueschlikon (CH); Evangelos S. Eleftheriou, Rueschlikon (CH); Robert Haas, Rueschlikon (CH); Xiao-Yu Hu, Rueschlikon (CH); Ilias Iliadis, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 782 days.

(21) Appl. No.: 12/627,364

(22) Filed: Nov. 30, 2009

(65) Prior Publication Data

US 2011/0131472 A1   Jun. 2, 2011

(51) Int. Cl.
G11C 29/00 (2006.01)
(52) U.S. Cl.
USPC ............ 714/773; 714/6.3; 714/752; 714/756; 714/761
(58) Field of Classification Search
USPC .................... 714/6.3, 752, 756, 761, 762, 773
See application file for complete search history.

(56) References Cited

U.S. PATENT DOCUMENTS

| | | | |
|---|---|---|---|
| 5,572,466 A | 11/1996 | Sukegawa | |
| 6,553,510 B1 | 4/2003 | Pekny | |
| 6,662,264 B2 | 12/2003 | Katayama et al. | |
| 6,847,574 B2 | 1/2005 | Santin | |
| 6,952,752 B2 | 10/2005 | Katayama et al. | |
| 7,177,189 B2 | 2/2007 | Linde et al. | |
| 7,263,591 B2 | 8/2007 | Estakhri et al. | |
| 7,331,010 B2* | 2/2008 | Dell et al. | 714/767 |
| 7,954,021 B2* | 5/2011 | Lucas et al. | 714/723 |
| 8,140,942 B2* | 3/2012 | Dell et al. | 714/769 |
| 2008/0140724 A1* | 6/2008 | Flynn et al. | 707/104.1 |
| 2008/0147968 A1* | 6/2008 | Lee et al. | 711/103 |
| 2008/0148303 A1* | 6/2008 | Okamoto et al. | 720/652 |
| 2009/0037652 A1 | 2/2009 | Yu et al. | |
| 2009/0083482 A1 | 3/2009 | Price et al. | |
| 2009/0204872 A1* | 8/2009 | Yu et al. | 714/773 |
| 2009/0287956 A1* | 11/2009 | Flynn et al. | 714/6 |
| 2010/0211833 A1* | 8/2010 | Weingarten | 714/704 |
| 2011/0099419 A1* | 4/2011 | Lucas et al. | 714/6.32 |

OTHER PUBLICATIONS

Fusion-io's Solid State Storage—A New Standard For Enterprise-Class Reliability, 2007.

* cited by examiner

*Primary Examiner* — Charles Ehne
(74) *Attorney, Agent, or Firm* — Cantor Colburn LLP; Daniel Morris (57) ABSTRACT

Systems and methods are provided that confront the problem of failed storage integrated circuits (ICs) in a solid state drive (SSD) by using a fault-tolerant architecture along with one error correction code (ECC) mechanism for random/burst error corrections and an L-fold interleaving mechanism. The systems and methods described herein keep the SSD operational when one or more integrated circuits fail and allow the recovery of previously stored data from failed integrated circuits and allow random/burst errors to be corrected in other operational integrated circuits. These systems and methods replace the failed integrated circuits with fully functional/operational integrated circuits treated herein as spare integrated circuits. Furthermore, these systems and methods improve I/O performance in terms of maximum achievable read/write data rate.

17 Claims, 8 Drawing Sheets

SOLID-STATE STORAGE SYSTEM WITH PARALLEL ACCESS OF MULTIPLE FLASH/PCM DEVICES

BACKGROUND

Flash-based storage is currently the most common non-volatile RAM technology used in solid-state drives (SSDs), while it is foreseen that in the near future other technologies, like the phase-change storage-class memory (PCM), will be used in solid-state storage systems. The usual approach of achieving high performance I/Os is to use multiple, independent and parallel accessed channels. The data rate achieved in each channel is limited mainly by the 'Page Write' and 'Page Read' time required by the flash device to complete the respective operation internally and by the clock rate at the device's interface.

One of the major issues of using flash chips or flash integrated circuit devices (ICs) in SSDs today, along with cost and I/O performance, is reliability and durability, due to the limited number of write/erase operations that can be performed in the flash cells. This phenomenon is known as the endurance problem. Typical maximum number of write/erase operations for flash cells is in the range of 10000 to 100000 whereas typical maximum number of write operations for PCM cells is in the range of 1 million to 100 million. Furthermore, measurements performed in deployed flash-based SSDs indicate that flash chips used in SSDs (especially in server applications, where a high I/O rate is required) present a higher than expected failure rate (one or more flash ICs fail).

Since each SSD uses a large number of flash ICs (usually a few tens) the probability of having at least a failed IC inside a SSD is significant. Depending on the SSD's architecture, when a flash device fails, part of the SSD (and in some cases the whole SSD) fails. In existing SSDs, a user sector or an encoded user sector or a codeword is stored in a single flash IC and the additional parity symbols, which are generated using a first error correction code, are used for correcting random/burst errors, i.e., for providing data reliability and increased endurance. In this case, when a Flash IC fails, the codewords stored in this specific IC cannot be recovered, which is undesirable. Existing SSDs use a second error detection/correction code to deal with the problem of device failure. However, this increases the complexity of the storage-system implementation.

SUMMARY

According to one embodiment of the present invention, a solid-state storage system is provided. The system includes a plurality of integrated circuits for storing data; a controller coupled to the plurality of storage devices via one or more of a plurality of channels, the controller operably controls the operations of the plurality of integrated circuits and employs one L-fold interleaved error correction code to provide data reliability and increased endurance and to enable the recovery of data from failed integrated circuits; and one or more spare integrated circuits selectively coupled to one or more of the plurality of channels when one or more of the plurality of integrated circuits coupled thereto fails.

According to another embodiment of the present invention, a method for providing data reliability and increased endurance and enabling the recovery of data from failed integrated circuits of a solid-state drive is provided. The method includes storing codeword fragments in a plurality of integrated circuits utilizing a controller employing one L-fold interleaved error correction code, the controller being in signal communication with the plurality of integrated circuits via one or more of a plurality of channels, the controller operably controlling the operations of the plurality of integrated circuits; and coupling one or more spare integrated circuits to one or more of the plurality of channels when one or more of the plurality of integrated circuits coupled thereto fail.

According to yet another embodiment of the present invention, a method for providing data reliability and increased endurance and enabling the recovery of data from failed integrated circuits of a solid-state drive is provided. The method includes storing codeword fragments in a plurality of integrated circuits utilizing an SSD controller employing one L-fold interleaved error correction code, the SSD controller being in signal communication with the plurality of integrated circuits via one or more of a plurality of channels, the controller operably controlling the operations of the plurality of integrated circuits; detecting failures in one or more of the plurality of integrated circuits; coupling one or more spare integrated circuits to one or more of the plurality of channels when one or more of the plurality of integrated circuits coupled thereto fail; and recovering lost data due to the failure of one or more of the plurality of integrated circuits and correcting errors on one or more of the plurality of integrated circuits that are operational, the recovered data is stored in one or more spare integrated circuits.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Exemplary embodiments of the present invention provide flash storage systems and methods that confront the problem of failed storage integrated circuits (ICs) in a solid state drive (SSD) by using a fault-tolerant architecture along with an error correction code (ECC) mechanism for random/burst error corrections and an interleaving mechanism. Generally speaking, the systems and methods described herein keep the SSD operational when one or more integrated circuits fail and allow the recovery of previously stored data from failed integrated circuits and allow random/burst errors to be corrected in other operational integrated circuits. These systems and methods replace the failed integrated circuits with fully functional/operational integrated circuits treated herein as spare integrated circuits. Furthermore, the fault-tolerant architecture implemented in exemplary embodiments can improve I/O performance in terms of maximum achievable read/write data rate.

The integrated circuits described herein can be any type of solid-state storage device. In one exemplary embodiment, the integrated circuits described herein are flash devices, which are electrically rewritable nonvolatile digital storage mediums. Of course, other types of solid-state storage devices can be used in other exemplary embodiments and should not be limited to the examples described herein.

The term "SSD controller" or "controller" as used herein refers to an application specific integrated circuit (ASIC), and electronic circuit, a processor (shared, dedicated, or group) and solid-state memory that executes one or more software or firmware programs/algorithms, a combinational logic circuit, and/or other suitable components that provide the described functionality. The SSD controller performs several critical functions such as wear leveling, garbage collection, management of bad blocks, mapping of logical block address (LBA) to physical block address (PBA) and error correction encoding/decoding in order to ensure high reliability and availability of stored data, high device endurance and long storage-system lifetime.

Figure 1:
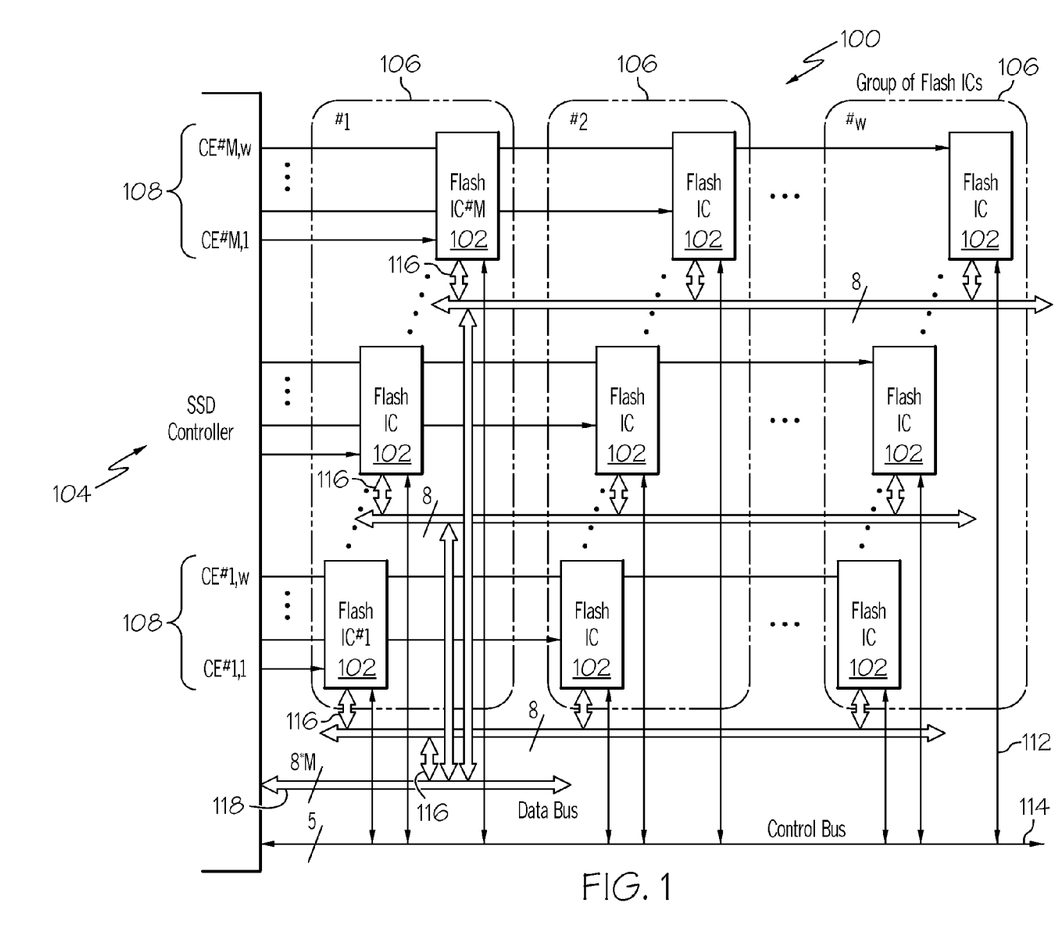
FIG. 1 is a schematic of a solid-state drive and its architecture in accordance with one exemplary embodiment of the present invention.

FIG. 1 illustrates a schematic of a solid state drive (SSD) 100 and its fault-tolerant architecture according to one exemplary embodiment of the present invention. The SSD 100 includes a plurality of integrated circuits 102 for storing data. Each of the integrated circuits is each in signal communication with an SSD controller or controller 104. The plurality of integrated circuits 102 are organized in a plurality of IC groups 106 where each group includes a number of integrated circuits 102, specifically M number of integrated circuits as shown. The integrated circuits are further organized such that each integrated circuit 102 in a group is in signal communication with one or more channels 108 stemming from the SSD controller 104. These channels 108 are used to enable/disable the integrated circuits 102 attached to a particular data channel 116. The SSD controller 104 communicates to the integrated circuits through data signals, which are generally indicated by double arrows 116, via a data bus 118. In accordance with one embodiment, channels 116 are asynchronous channels. In one embodiment, each channel 116 includes one or more sub-channels used to access the integrated circuits 102 respectively. In accordance with one exemplary embodiment, the channels 116 are synchronous. This synchronous configuration allows the SSD controller 104 to access the plurality of integrated circuits 102 simultaneously. In an alternate embodiment, the channels 116 are accessed in parallel but as independent channels. Therefore, the SSD 100 can include both synchronous and asynchronous channels. As such, different integrated circuits in a group can be accessed simultaneously (synchronous) or at different times (asynchronous).

The SSD controller 104 accesses the plurality of integrated circuits 102 in a synchronous fashion in accordance with one exemplary embodiment. In other words, the SSD controller 104 drives each integrated circuit 102 at the same time. This is accomplished using the same control signals, which are generally indicated by double arrows 112, communicated by the SSD controller 104 via a control bus 114. With this synchronous architecture, the same control pins from the SSD controller can be shared to all the synchronous channels. As such, the same control signals 112 from the SSD controller 104 are used to drive all the integrated circuits for all the channels. As a result, the pin count at the SSD controller side is reduced. This allows additional channels to be used in the SSD, thereby increasing the read data rate and write data rate of the SSD 100, which provides an overall increase in system performance. In one example, a 20% increase, both for read and write operations, is achieved. This synchronous architecture is advantageous for situations in which the number of pins on the SSD controller is limited. It is contemplated that the SSD controller 104 accesses the integrated circuits 102 in an asynchronous manner in accordance with other exemplary embodiments. However, the benefit for a reduced pin count for the SSD controller and/or increased read/write data rate is lost.

Figure 2:
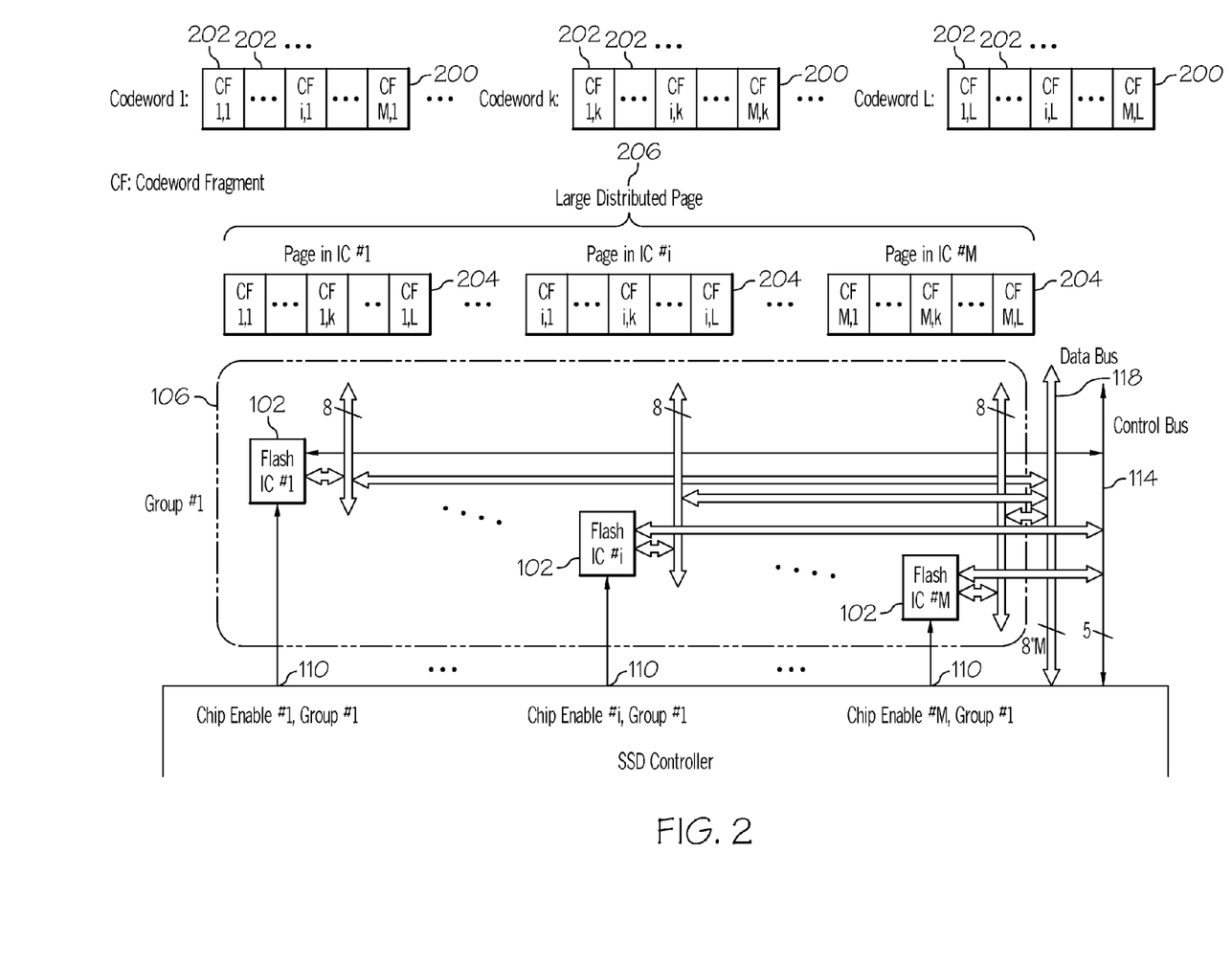
FIG. 2 is a schematic of an IC group of integrated circuits of the solid-state drive in accordance with one exemplary embodiment of the present invention.

FIG. 2 illustrates a single IC group 106 of the SSD 100 in accordance with one exemplary embodiment. Although the SSD 100 includes a number of IC groups, only one is illustrated in detail in FIG. 2. The IC group 106 (i.e., group #1) is configured to store a plurality of user data sectors or codewords 200 (i.e., codeword 1-codeword L) each comprising a combination of data symbols and parity symbols. The parity symbols comprises of error code correction (ECC) parity bits and cyclic redundancy check (CRC) parity bits used for detecting/correcting up to a maximum number of random/burst errors. Each symbol can include n bits of data depending on the error correction code (ECC) being implemented. For example, n can equal 1 if ECC code is binary Bose-Chaudhuri-Hocquenghem (BCH) codes, n can equal 8 if ECC code is a Reed-Solomon (RS) code using 8-bit symbols, n can equal 12 if ECC code is RS code using 12-bit symbols, or otherwise. Nevertheless, in each integrated circuit within a group, a limited number of symbols per codeword are stored so that the number of symbols per integrated circuited remains less than or equal to the number of ECC parity symbols. These parity symbols are not only used for correcting errors in order to provide data reliability and increased endurance, but can also be used to recover missing data on failed integrated circuits, which are generally considered as erasures whose locations are known to the ECC decoder implemented by the SSD controller 104.

Each codeword is distributed among the integrated circuits 102 of a particular group such that each integrated circuit 102 within the group includes a fragment 202 of each of the codewords 200 forming a page of codeword fragments 204 for each integrated circuit within the group. As such, each page 204 includes codeword fragments from different codewords. For example, one page includes a fragment from codeword 1, codeword k, and codeword L. These pages 204 are written into their respective integrated circuit simultaneously as a large distributed page (LDP) 206. Although not illustrated, it should be understood that each IC group 106 of the SSD 100 can support a number of LDPs and should not be limited to the configuration shown in FIG. 2. As such, each LDP supported by each integrated circuit group includes multiple codewords and hence multiple ECC/CRC parity symbols. Furthermore, each LDP is distributed over M number of integrated circuits in a group. Therefore, each integrated circuit can include a number of pages 204. An error correction code is defined as the list of all possible codewords. A L-fold interleaved error correction code interleaves L codewords from the list of all possible codewords. The LDP shown in FIG. 2 was generated using a L-fold interleaved error correction code. The configuration in FIG. 2 achieves both data reliability and increased endurance and robustness against device failures by using a single L-fold interleaved error detection/correction code. The L-fold interleaved error correction code in FIG. 2 is employed to provide data reliability and increased endurance and to enable the recovery of data from failed integrated circuits. The use of a single error correction code to achieve both data reliability and increased endurance and robustness against device failures reduces implementation complexity.

In one embodiment, the term "increased endurance" means that the endurance of the storage cells of the integrated circuits is increased by employing the one L-fold interleaved error correction code when compared to the endurance of the storage cells of the integrated circuits that do not employ any error correction code.

Figure 3A:
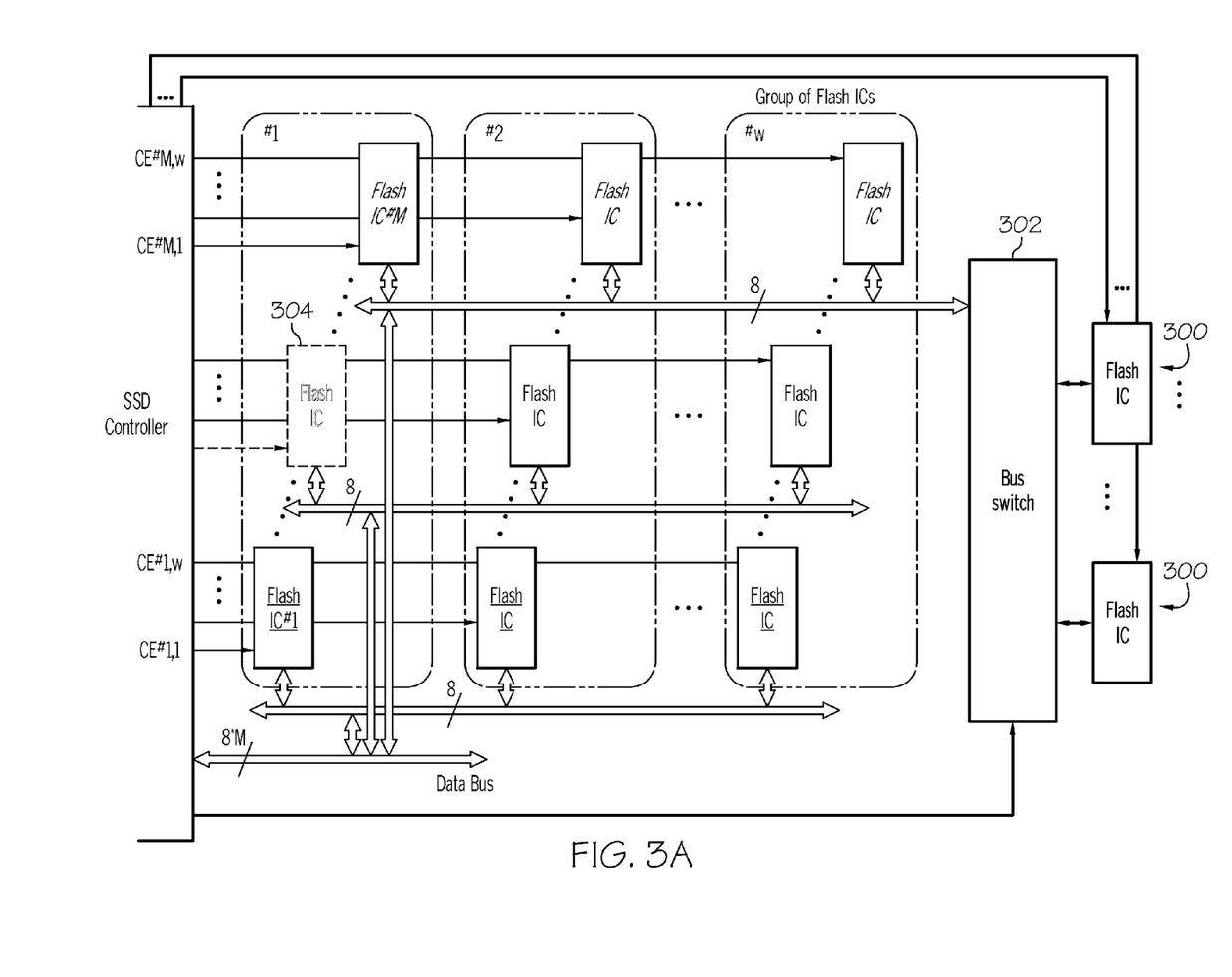
FIG. 3A is a schematic of one or more spare integrated circuits selectively coupled to one or more channels to which failed integrated circuits are attached to in accordance with one exemplary embodiment of the present invention.
Figure 3B:
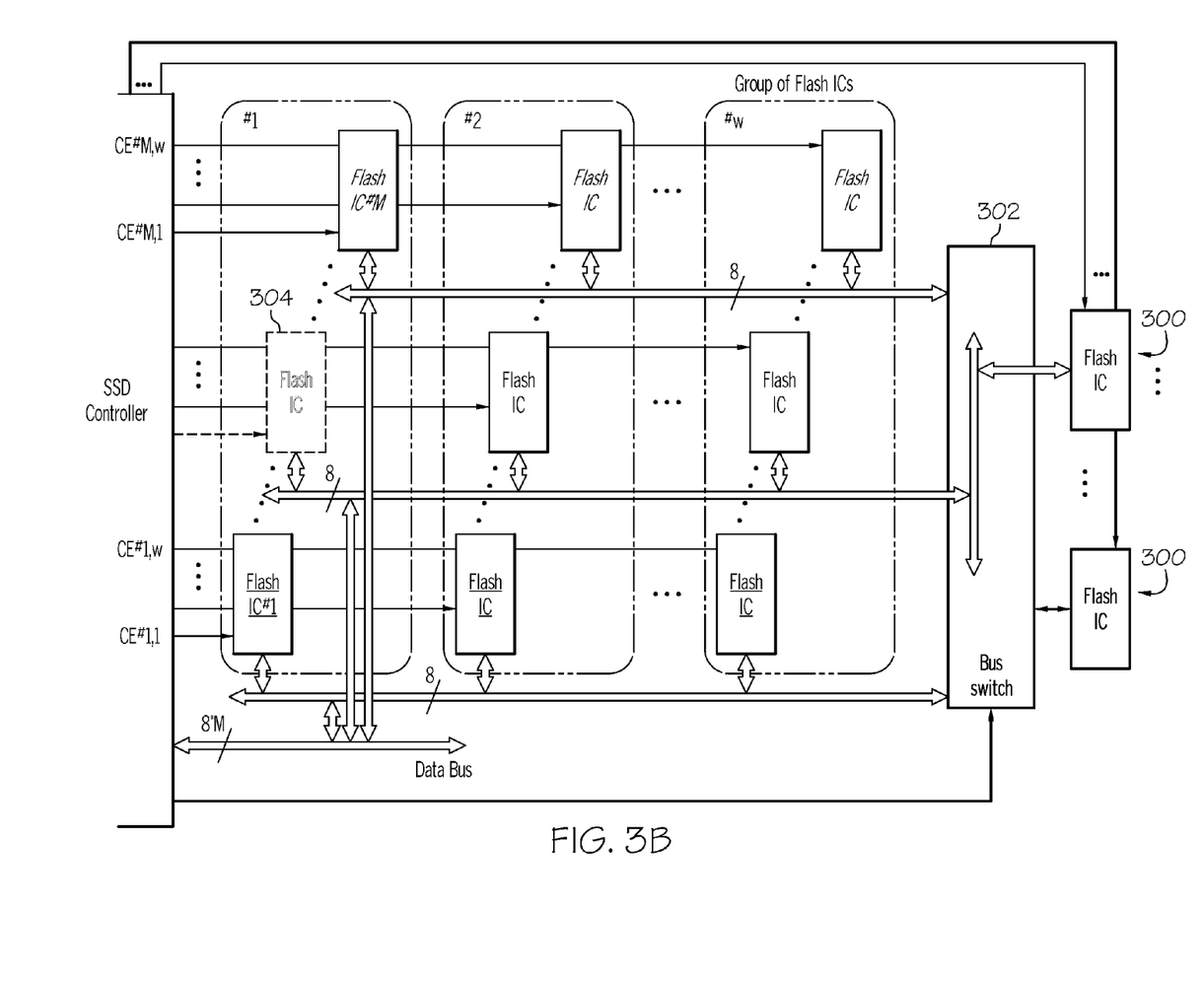
FIG. 3B is a schematic of a spare integrated circuit coupled to a channel to which a failed integrated circuit is attached to via a bus switch in accordance with one exemplary embodiment of the present invention.
Figure 3C:
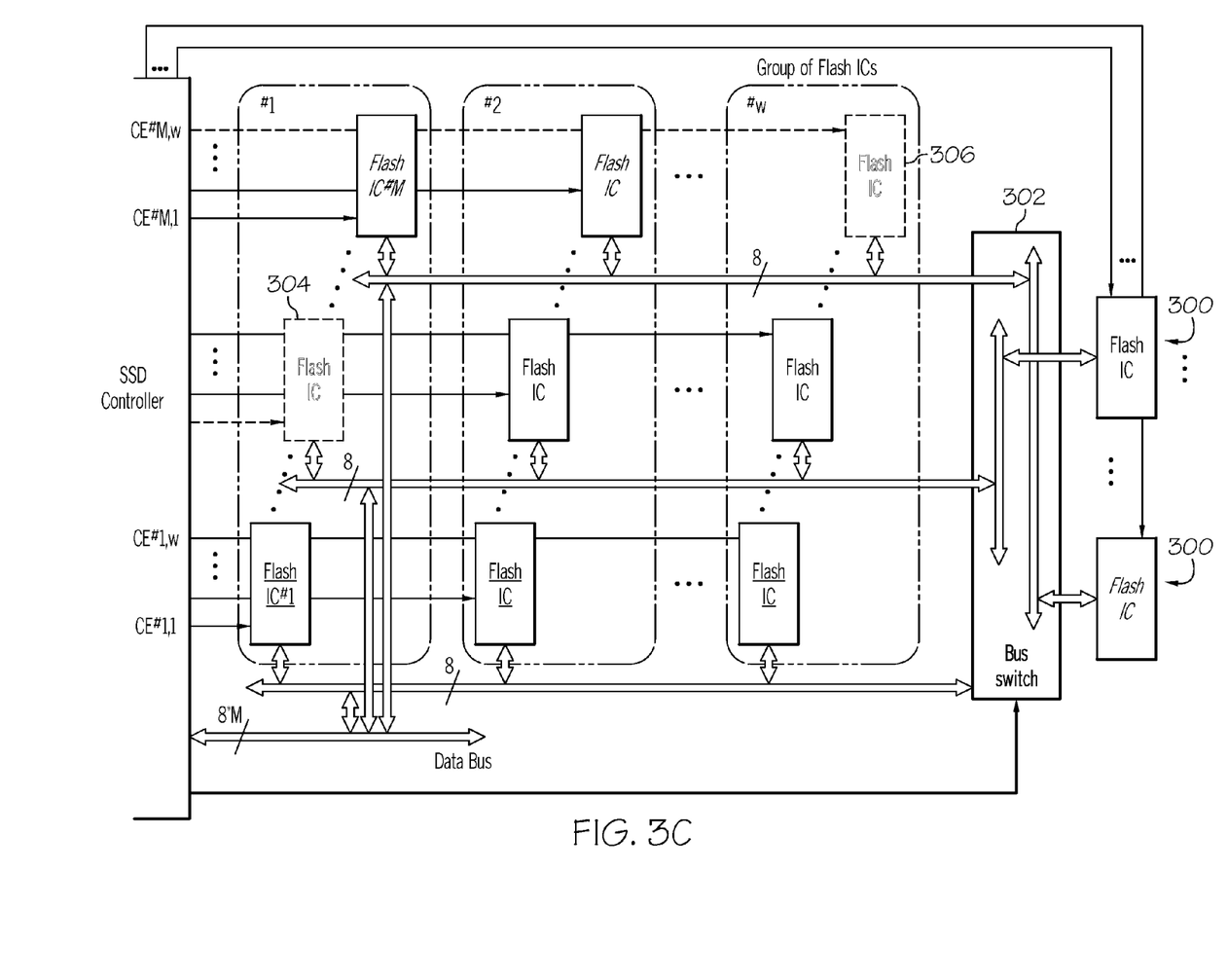
FIG. 3C is a schematic of another spare integrated circuit coupled to the same channel to which another failed integrated circuit is attached to via the bus switch in accordance with one exemplary embodiment of the present invention.
Figure 3D:
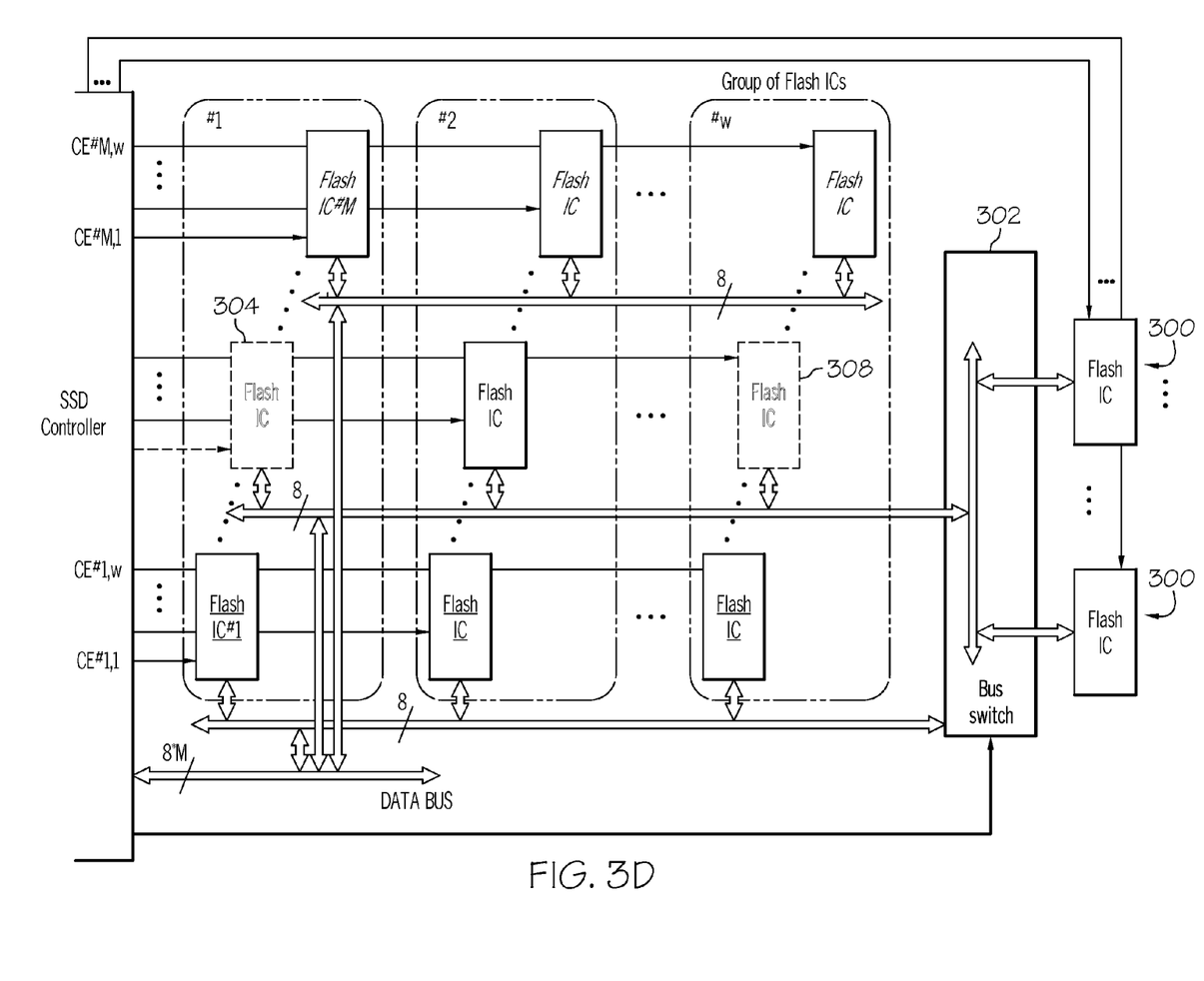
FIG. 3D is a schematic of another spare integrated circuit coupled to another channel to which another failed integrated circuit is attached to via the bus switch in accordance with one exemplary embodiment of the present invention.

In accordance with one exemplary embodiment, the SSD controller 104 selectively couples one or more spare integrated circuits 300 to one or more of the plurality of channels to which failed integrated circuits are attached to as shown in FIG. 3A. This is accomplished via a bus switch 302, which connects an available integrated circuit 300 to a specific channel in which the failed integrated circuit is connected to. The spare integrated circuits 300 are not associated with a specific channel. With this configuration, a multiple number of integrated circuits 102 can fail on the same channel or on multiple channels. For example, if one of the integrated circuits 102, generally indicated in this example by reference 304, on one of the channels fails, SSD controller 104 couples the channel with the failed integrated circuit 304 to the first available spare integrated circuit as shown in FIG. 3B. In this example, if another one of the integrated circuits 102, generally indicated in this example by reference 306, on a different channel fails, SSD controller 104 couples that channel to another available spare as shown in FIG. 3C. Alternatively, if another one of the integrated circuits 102, which is generally indicated in this example by reference 308, on the same channel of integrated circuit 304 fails, SSD controller 104 couples that same channel to another available spare as shown in FIG. 3D. Although only two spare integrated circuits are shown, it should be understood that any number of spare integrated circuits could be used and should not be limited to the configuration shown herein.

It is contemplated that one of the IC groups 106 is used as a reservoir of spare integrated circuits in accordance with other exemplary embodiments. In these embodiments, when an integrated circuit fails, the data stored in the reservoir group is transferred to others groups and each integrated circuit of the reservoir group can be used as the spare integrated circuits. Of course, this approach as well as the other approach described above can be used in combination for replacing failed integrated circuits. It is further contemplated that one or more of the integrated circuits 102 not currently being used can be utilized as spare integrated circuits.

In accordance with one embodiment, the SSD controller 104 operably detects failed integrated circuits by various means (e.g., hardware control signals and/or predetermined bits in its status register). In one specific embodiment, the SSD controller 104 detects failed integrated circuits based on hardware indication such as incorrect timing signals. Of course, other methods of detecting failed integrated circuits can be used in other exemplary embodiments.

In operation, when the SSD controller 104 detects a failed integrated circuit, it initiates a reconstruction procedure or data recovery process. The reconstruction procedure includes locating the integrated circuits on the same group in which the failed integrated circuit is located and reading each one of the large distributed pages 206 within the group since each integrated circuit includes fragments of each codeword as described above. The reconstruction procedure further includes the SSD controller 104 performing an ECC decoding algorithm to regenerate the corrupted data on the failed integrated circuit. The ECC algorithm can be any conventional decoding algorithm or modified decoding algorithm. The SSD controller 104 then stores this regenerated data in one of the spare integrated circuits 300 connected to the channel in which the failed integrated circuit is coupled to.

Assuming that a codeword contains u erasures with known locations and e errors whose locations are not known. The minimum Hamming distance d of a linear ECC code determines the error/erasure correction capability of the code. In accordance with one embodiment, the ECC decoding algorithm performed by the SSD controller 104 can correct u erasures and e errors in a codeword if $(u+2e) \leq (d-1)$.

Figure 4A:
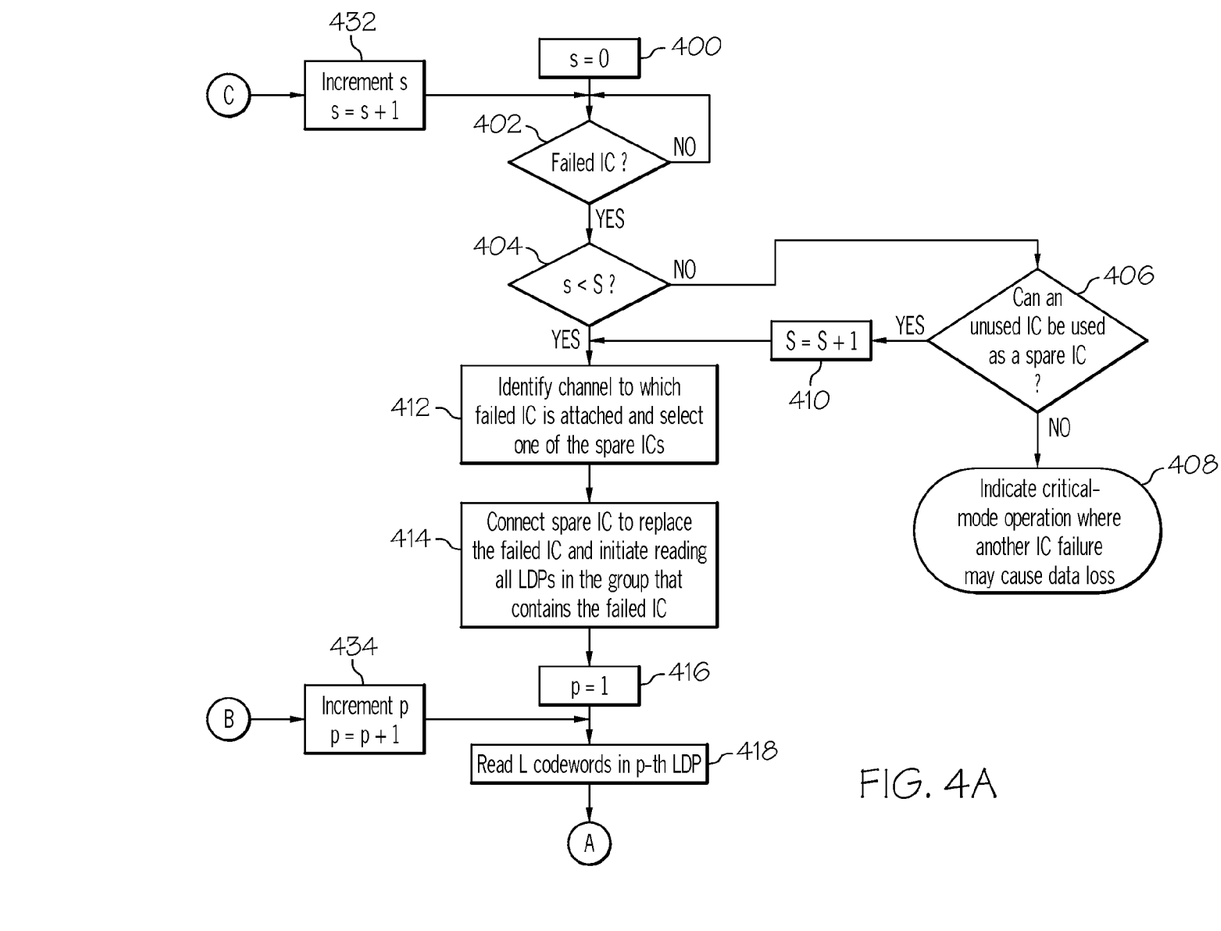
FIGS. 4A-4B illustrate a flow diagram of a method for recovering data from failed integrated circuits in the solid-state drive in accordance with one exemplary embodiment of the present invention.
Figure 4B:
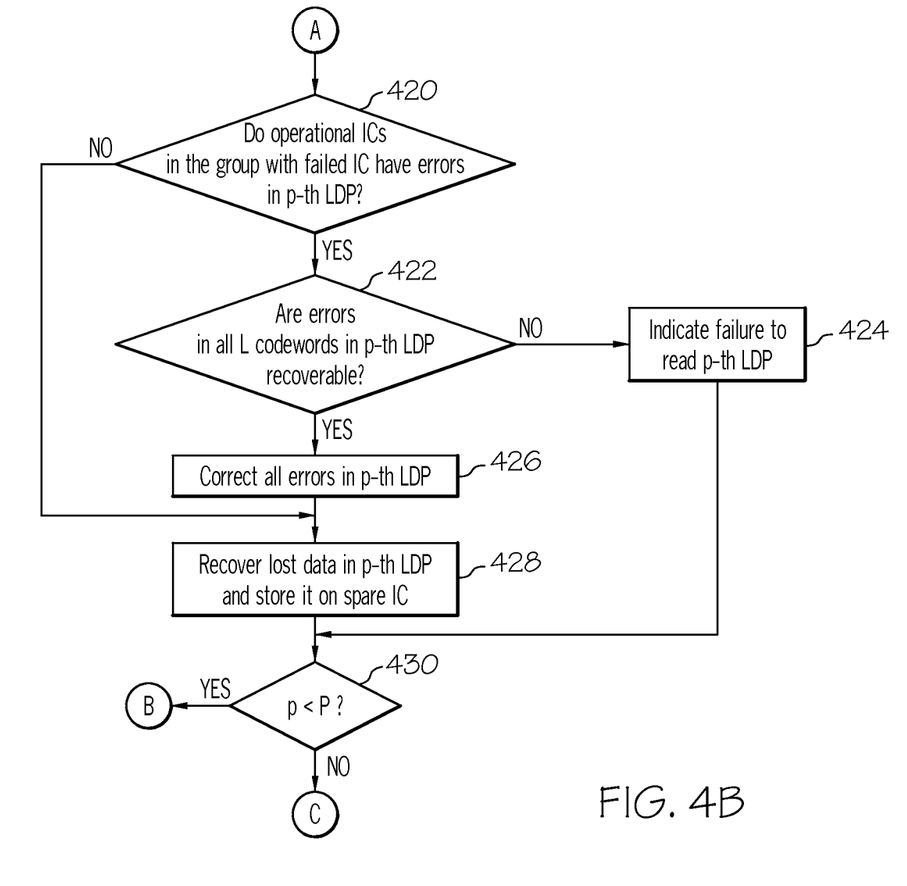

FIGS. 4A-4B illustrate a method for recovering data from a failed integrated circuit in accordance with one exemplary embodiment. Beginning the operation at block 400, s is set to 0. In this example, s denotes the total number of spares integrated circuits that have been used to replace failed integrated circuits. At block 402, determine if an integrated circuit failed. In one embodiment, the SSD controller 104 detects a failed integrated circuit based on hardware indication, such as receiving incorrect timing signals. If the answer is no, perform block 402 until a failed integrated circuit is detected. If the answer is yes, determine if s<S at block 404. S is total number of spare integrated circuits available in the SSD 100. If the answer is no, determine if an unused integrated circuit can be used as a spare integrated circuit at block 406. In other words, it is determined in block 406 whether one of the operational integrated circuits 102 can be used as a spare integrated circuit. If the answer is no, indicate critical-mode operation where another IC failure may cause data loss at block 408. Data is lost if two or more ICs in a group, which may include one or more spare ICs, fail. If the answer at block 408 is yes, increment S by 1 at block 410. At this point, the number of spare integrated circuits is increased by one since an unused integrated circuit from one of the groups is used as a spare integrated circuit. As such, the total storage capacity in the SSD is reduced. Next, identify the channel to which the failed integrated circuit is attached and select one of the spare integrated circuits at block 412. If the answer to block 404 is yes, continue to block 412. Then, connect the spare integrated circuit to replace the failed integrated circuit and initiate reading all LDPs in the group that contains the failed integrated circuit at block 414. Reading all LDPs is initiated at block 416. Specifically, set p to 1 at block 416. Here, p denotes the number of the LPD that is being read during recovery from integrated circuit failure such that $1 \leq p \leq P$. At block 418, read L codewords in p-th LDP. In this case since p is set to 1, the SSD controller 102 reads L codewords or all the codewords in the first LDP. Next, determine if operational integrated circuits in the group with the failed integrated circuit have errors in p-th LDP at block 420. If the answer is yes, then determine if the errors in all L codewords in p-th LDP are recoverable at block 422. This is normally based on how much redundancy is put into the code. In one embodiment, the ECC decoding algorithm can correct u erasures and e errors in a codeword if (u+2e)≦(d−1). If the answer to block 422 is no, indicate failure to read p-th LDP at block 424. If the answer to block 422 is yes, correct errors in p-th LDP at block 426. Then, recover lost data in p-th LDP and store it on the spare integrated circuit at block 428. All the errors in the codeword fragments stored on operational integrated circuits in the group are recoverable if e<floor((d−1−m)/2), where floor((d−1−m)/2) is an integer rounded down, e represents the number of errors in (L−1) codeword fragments on operational integrated circuits in a particular codeword and m denotes the maximum number of symbols in a codeword that are lost, missing, or erased due to chip failure. At block 430, determine if p<P, where P denotes the total number of pages in an integrated circuit, which is equal to the total number of LDPs in a group. If the answer is no, then increment s by 1 at block 432. If the answer is yes, increment p by 1 at block 434. As such, each LDP in the group is read and the errors and erasures in all the L codewords in each LDP of the group are corrected if possible. As shown, if the answer to block 420 is no, proceed to block 428. Further, after a failure is indicated at block 424, proceed to block 430.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A solid-state storage system, comprising:
a plurality of integrated circuits for storing data;
a controller coupled to the plurality of integrated circuits via one or more of a plurality of channels, the controller operably controls the operations of the plurality of integrated circuits and employs one L-fold interleaved error correction code to provide data reliability and increased endurance and to enable the recovery of data from failed integrated circuits; and
one or more spare integrated circuits selectively coupled to one or more of the plurality of channels when one or more of the plurality of integrated circuits coupled thereto fails,
the controller storing the recovered data from the failed integrated circuits in at least one spare integrated circuit in response to selecting the one or more spare integrated circuits,
wherein the plurality of integrated circuits are organized in a plurality of groups, each of the plurality of groups having one or more of the plurality of integrated circuits each having a plurality of pages comprising fragments of one or more codewords, the plurality of pages from the plurality of integrated circuits form a plurality of large distributed pages, each of the plurality of large distributed pages includes one of the plurality of pages from each one of the plurality of integrated circuits, and
wherein each codeword includes data symbols and parity symbols to recover data and to detect and correct errors.

2. The storage system of claim 1, wherein one or more of the plurality of channels are coupled to one or more of the plurality of integrated circuits in each of the plurality of groups, the plurality of channels being operated synchronously.

3. The storage system of claim 1, wherein the plurality of channels are grouped in one or more primary channels, each of the one or more primary channels having one or more of the plurality of channels, and the one or more primary channels being operated asynchronously.

4. The storage system of claim 3, wherein lost data from a failed integrated circuit is recovered by reading each codeword in each of the one or more large distributed pages in one of the plurality of groups with the failed integrated circuit.

5. The storage system of claim 1, wherein the each of the plurality of large distributed pages having one or more codewords enable for the recovery of lost data due to the failure of one or more of the plurality of integrated circuits and enable for the correction of one or more errors on one or more of the plurality of integrated circuits that are operational.

6. The storage system of claim 1, wherein the controller operably couples one or more spare integrated circuits to one or more of the plurality of channels via a bus switch when a failure to one or more of the plurality of integrated circuits is detected.

7. The storage system of claim 1, wherein the plurality of integrated circuits are flash-based storage devices.

8. The storage system of claim 1, wherein each of the plurality of integrated circuits is controlled by a plurality of control signals generated from the controller, each of the plurality of integrated circuits configured to receive the plurality of control signals simultaneously.

9. The storage system of claim 1, wherein one or more of the plurality of integrated circuits available are utilized as spare integrated circuits.

10. A method for providing data reliability and increased endurance and enabling the recovery of data from failed integrated circuits of a solid-state drive, comprising:
- storing codeword fragments in a plurality of integrated circuits utilizing a controller employing one L-fold interleaved error correction code, the controller being in signal communication with the plurality of integrated circuits via one or more of a plurality of channels, the controller operably controlling the operations of the plurality of integrated circuits;
- coupling one or more spare integrated circuits to one or more of the plurality of channels when one or more of the plurality of integrated circuits coupled thereto fail; and
- storing recovered data in at least one spare integrated circuit in response to the coupling one or more spare integrated circuits; and
- organizing the plurality of integrated circuits in a plurality of groups, each of the plurality groups having one or more of the plurality of integrated circuits each having a plurality of pages comprising fragments of one or more codewords, wherein the plurality of pages from the plurality of integrated circuits form a plurality of large distributed pages, each of the plurality of large distributed pages includes one of the plurality of pages from each one of the plurality of integrated circuits, and wherein each codeword includes data symbols and parity symbols used for recovering data and detecting and correcting errors.

11. The method of claim 10, wherein one or more of the plurality of channels are coupled to one or more of the plurality of integrated circuits in each of the plurality of groups, the plurality of channels being operated synchronously.

12. The method of claim 10, wherein the plurality of channels are grouped in one or more primary channels, each of the one or more primary channels having one or more of the plurality of channels, and the one or more primary channels being asynchronously operated.

13. The method of claim 10, wherein the each of the plurality of large distributed pages having one or more codewords enable for the recovery of lost data due to the failure of one or more of the plurality integrated circuits and enable for the correction of one or more errors on one or more of the plurality of integrated circuits that are operational.

14. The method of claim 13, wherein lost data from a failed integrated circuit is recovered by reading each codeword in each of the one or more large distributed pages in one of the plurality of groups with the failed integrated circuit.

15. The method of claim 14, further comprising controlling each of the plurality of integrated circuits through a plurality of control signals generated from the SSD controller, each of the plurality of integrated circuits configured to receive the plurality of control signals simultaneously.

16. The method of claim 10, wherein one or more of the plurality of integrated circuits available are utilized as spare integrated circuits.

17. A method for providing data reliability and increased endurance and enabling the recovery of data from failed integrated circuits of a solid-state drive, comprising:
- storing codeword fragments in a plurality of integrated circuits utilizing an SSD controller employing one L-fold interleaved error correction code, the SSD controller being in signal communication with the plurality of integrated circuits via one or more of a plurality of channels, the SSD controller operably controlling the operations of the plurality of integrated circuits;
- detecting failures in one or more of the plurality of integrated circuits;
- coupling one or more spare integrated circuits to one or more of the plurality of channels when one or more of the plurality of integrated circuits coupled thereto fail;
- recovering lost data due to the failure of one or more of the plurality of integrated circuits and storing the recovered lost data in at least one spare integrated circuit in response to the coupling one or more spare integrated circuits;
- organizing the plurality of integrated circuits in a plurality of groups, each of the plurality of groups having one or more of the plurality of integrated circuits each having a plurality of pages comprising fragments of one or more codewords, wherein the plurality of pages from the plurality of integrated circuits form a plurality of large distributed pages, each of the plurality of large distributed pages includes one of the plurality of pages from each one of the plurality of integrated circuits; and
- correcting errors on one or more of the plurality of integrated circuits that are operational based on the one or more codewords, each codeword including data symbols and parity symbols to perform the correcting.

* * * * *